(12) United States Patent
Chen et al.

(10) Patent No.: US 8,298,861 B2
(45) Date of Patent: Oct. 30, 2012

(54) PACKAGE STRUCTURE OF COMPOUND SEMICONDUCTOR DEVICE AND FABRICATING METHOD THEREOF

(75) Inventors: Pin Chuan Chen, Hsinchu County (TW); Shen Bo Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 210 days.

(21) Appl. No.: 12/856,052

(22) Filed: Aug. 13, 2010

(65) Prior Publication Data

US 2010/0304535 A1    Dec. 2, 2010

Related U.S. Application Data

(62) Division of application No. 12/370,923, filed on Feb. 13, 2009, now Pat. No. 7,893,528.

(30) Foreign Application Priority Data

Feb. 20, 2008  (TW) ................................ 97105846 A

(51) Int. Cl.
*H01L 21/00* (2006.01)
(52) U.S. Cl. ................. 438/108; 438/124; 257/E21.502
(58) Field of Classification Search ................. 257/124, 257/678–796, E21.502; 438/678–796, 108, 438/124
See application file for complete search history.

(56) References Cited

U.S. PATENT DOCUMENTS

2005/0139855 A1   6/2005  Wang et al.
2007/0200206 A1*  8/2007  Wong et al. .................... 257/666

FOREIGN PATENT DOCUMENTS

| CN | 1523681 A | 8/2004 |
| JP | 2000-77725 A | 3/2000 |
| JP | 2006-156704 A | 6/2006 |

* cited by examiner

*Primary Examiner* — Chuong A Luu
*Assistant Examiner* — Nga Doan
(74) *Attorney, Agent, or Firm* — Altis Law Group, Inc.

(57) ABSTRACT

A package structure of a compound semiconductor device comprises a thin film substrate, a die, at least one metal wire and a transparent encapsulation material. The thin film substrate comprises a first conductive film, a second conductive film, and an insulating dielectric material. The die is mounted on the surface of the first conductive film, and is electrically connected to the first conductive film and the second conductive film through the metal wire. The transparent encapsulation material overlays the first conductive film, second conductive film, and die. The surfaces of the first conductive film and second conductive film which is opposite the transparent encapsulation material act as electrodes. The insulating dielectric material is between the first conductive film and second conductive film.

3 Claims, 7 Drawing Sheets

PACKAGE STRUCTURE OF COMPOUND SEMICONDUCTOR DEVICE AND FABRICATING METHOD THEREOF

CROSS REFERENCE TO RELATED APPLICATIONS

This application is a divisional application of prior-filed U.S. patent application Ser. No. 12/370,923 field Feb. 13, 2009, which is based on and claims priority from R.O.C. Patent Application No. 097105846 filed Feb. 20, 2008.

BACKGROUND OF THE INVENTION (A) Field of the Invention

The present invention relates to a package structure of a compound semiconductor device and fabricating method thereof, and more particularly, to a thin package structure and fabricating method of a photoelectric semiconductor device.

(B) Description of the Related Art

Because the light emitting diode (LED) pertaining to the photoelectric device has advantages of a small body, high efficiency and long life, it is expected to be an excellent illumination source into the next generation. In addition, LCD (liquid crystal display) technology is developing rapidly and full color is the current trend in electronic product displays. Therefore, white series LEDs are not only applicable to indication lights and large size display screens but also to most consumer electronic products such as mobile phones and personal digital assistants (PDA).

FIG. 1 is a schematic cross sectional diagram of the conventional SMD (surface mount device) of an LED device. An LED die 12 is mounted on an N-type conductive copper foil 13b covering an insulation layer 13c through die bonding paste 11, and is electrically connected to a P-type conductive copper foil 13a and the N-type conductive copper foil 13b through metal wires 15. The assembly of the P-type conductive copper foil 13a, N-type conductive copper foil 13b and insulation layer 13c is on a substrate 13. Furthermore, a transparent encapsulation material 14 covers the substrate 13, metal wires 15 and die 12 so that the whole LED device 10 can be protected against damage from environmental and external forces.

The LED device 10 utilizes a common printed circuit board (PCB) as the substrate 13. The total thickness of the LED device 10 is limited by the insulation layer 13c of the substrate 13, and thus cannot be reduced further. However, the current trend of consumer electronics products is toward lightweight, small packages. Accordingly, each of the internal devices of the consumer electronics product and its shell needs to be miniaturized. On the other hand, the insulation layer 13c is made mostly of epoxy resin with poor heat dissipation, and therefore is not suitable for a high power chemical compound semiconductor as a heat-transferring path.

FIG. 2 is a schematic cross sectional diagram of a high integral package is structure disclosed by U.S. Patent Publication No. 2004/0090756. The package structure has an insulating layer coated on a temporary substrate, and has electrical circuits which have been previously designed and laid out on the insulating layer. Subsequently, LED dies 221 and 222 are adhered to a substrate 23, and the LED dies 221, 222 and the internal leads of the substrate 23 are connected to each other through metal wires 25 by the wire bonding (or through bumps by flip-chip bonding). Conventional epoxy resin covers the LED dies 221 and 222 by using a molding process. In order to reduce the thickness of the whole package, the temporary substrate is removed from the insulating layer by the illumination of laser light or UV light. Tin balls 26 are soldered to the default soldering pads. Thus, a highly integral and thinner package is obtained. However, the manufacturing processes of the package are complicated so that the cost of manufacture is high.

In view of the above, the consumer electronics market is in urgent need of a photoelectric compound semiconductor device with a thin type package. The device not only needs to have a reduced thickness for saving space, but also needs to address the heat dissipation problem. With such a device, reliable, high power electronics products which can be more easily manufactured.

SUMMARY OF THE INVENTION

One aspect of the present invention provides the package structure of a compound semiconductor device and fabricating method thereof. The semiconductor device has external electrodes or contacts uncovered by an encapsulation material. There is no printed circuit board between a die and external electrodes for transmitting electrical signals, so the heat dissipation of the device is improved.

Another aspect of the present invention provides the package structure of a very thin semiconductor device and fabricating method thereof. The thickness of the device can be reduced for saving space due to the use of a thin substrate or a metallic film.

According the aforesaid aspects, the present invention discloses the package structure of a compound semiconductor device comprising a thin film substrate, a die and a transparent encapsulation material. The thin film substrate comprises a first conductive film, a second conductive film, and an insulating dielectric material. The die is mounted on the surface of the first conductive film. The transparent encapsulation material overlays the first conductive film, second conductive film, and die. The surfaces of the first conductive film and second conductive film which is opposite the transparent encapsulation material act as electrodes. The insulating dielectric material is between the first conductive film and the second conductive film.

The thickness of the thin film substrate preferably ranges between 20-50 μm.

The insulating dielectric material is SiO, SiN, SiON, TaO, AlO, TiO, AlN, TiN, epoxy resin, silicone or insulating polymer.

The die is an LED die, a laser diode die or a photodiode die.

The package structure of the compound semiconductor device further comprises at least one metal wire electrically connecting the die and thin film substrate. The first conductive film further comprises a first wire-bonding groove for bonding the metal wire, and the second conductive film further comprises a second wire-bonding groove for bonding the metal wire.

The package structure of the compound semiconductor device further comprises a plurality of bumps electrically connecting the die and thin film substrate.

The first conductive film further comprises a die-bonding groove on which the die is mounted. A reflecting layer is overlaid on the surfaces of the die-bonding groove.

The package structure of the compound semiconductor device further is comprises a patterned insulating material layer stacked on the thin film substrate. The insulating material layer comprises a die-bonding groove for bonding the die and a wire-bonding groove for bonding the metal wire.

The present invention discloses the manufacturing method of the package structure of a compound semiconductor device comprising the steps of: providing a thin film substrate comprising a first conductive film, a second conductive film, and an insulating dielectric material; mounting a die onto the first conductive film, electrically connecting an anode of the die to the first conductive film, electrically connecting a cathode of the die to the second conductive film; and overlaying a transparent encapsulation material on the die.

The thin film substrate is manufactured by the following steps: providing a sheet; forming at least one slot to divide the sheet into the first conductive film and second conductive film, and filling the insulating dielectric material in the slot.

The slot is formed by a drilling process, an etching process or a punching process.

The manufacturing method further comprises a step of forming a die-bonding groove on the first conductive film.

The manufacturing method further comprises a step of forming a plurality of wire-bonding grooves on the first conductive film and second conductive film, wherein each of the wire-bonding grooves is formed where at least one of the metal wires is bonded.

The manufacturing method further comprises a step of stacking a patterned insulating material layer on the thin film substrate, wherein the insulating material layer comprises a die-bonding groove for bonding the die and a plurality of wire-bonding grooves for bonding at least one metal wire.

The step of mounting the die onto the thin film substrate further electrically connects the die to the thin film substrate by wire bonding or flip-chip bonding.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
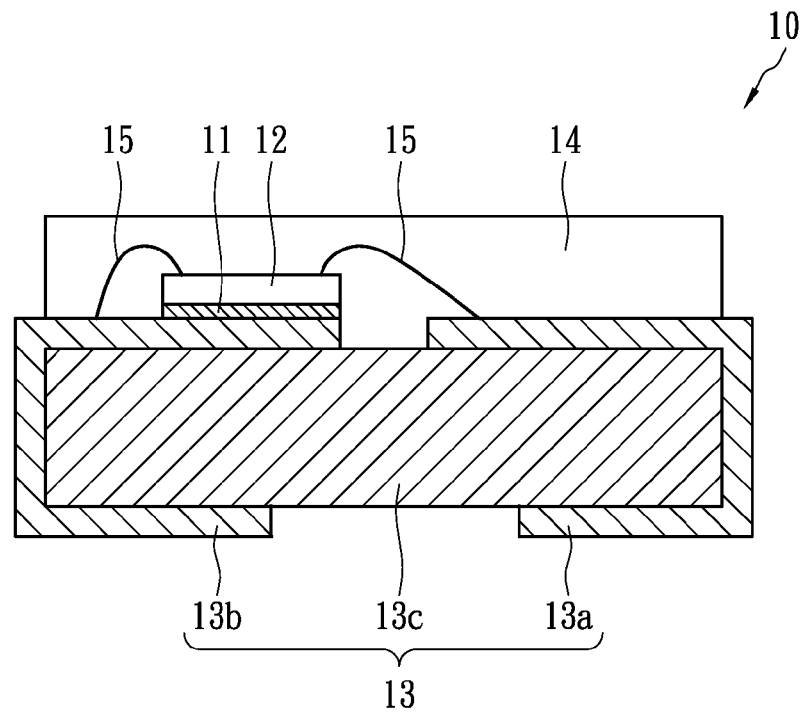
FIG. 1 is a schematic cross sectional diagram of the conventional SMD (surface mount device) of an LED device.
Figure 2:
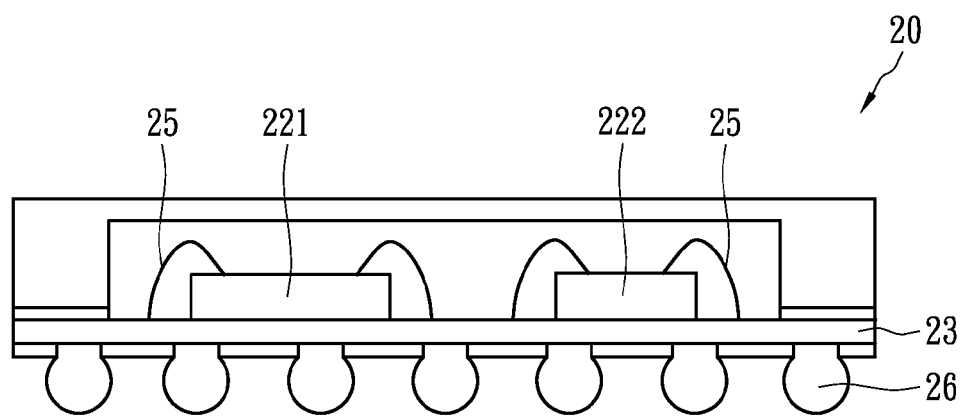
FIG. 2 is a schematic cross sectional diagram of a highly integral package structure disclosed by U.S. Patent Publication No. 2004/0090756.
Figure 3A:
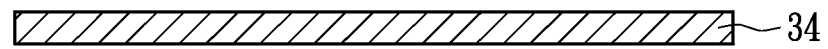
FIGS. 3A-3C are schematic illustrations showing the manufacturing steps of a thin film substrate in accordance with the present invention.
Figure 3B:
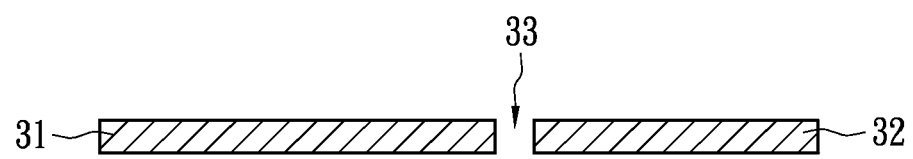
Figure 3C:
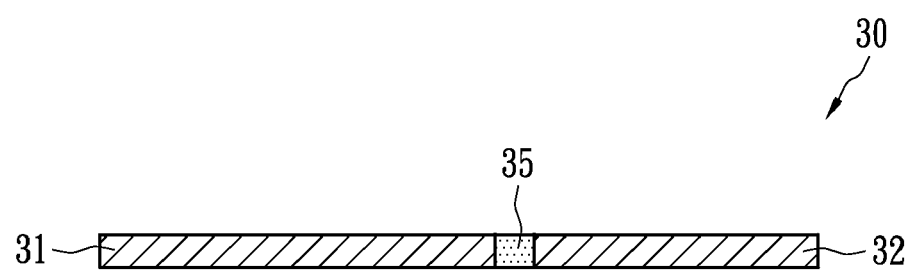

FIGS. 3A-3C are schematic illustrations showing the manufacturing steps of a thin film substrate in accordance with the present invention. As shown in FIG. 3A, a sheet 34 with a thickness of between 20-50 μm is provided; for instance copper foil or a metal film with superior conductivity. Moreover, a slot 33 is formed on the sheet 34 by a drilling process, an etching process or a punching process. The slot 33 separates a first conductive film 31 at one side from a second conductive film 32 at another side, that is, they are electrically isolated from each other, as shown in FIG. 3B. Subsequently, an insulating dielectric material 35 is filled in the slot 33 so that the manufacture of a thin film substrate 30 is finished. The insulating dielectric material 35 can be SiO, SiN, SiON, TaO, AlO, TiO, AN, TiN, epoxy resin, silicone or polymer. In this regard, the electrical insulation between the first conductive film 31 and second conductive film 32 is improved, and the thin film substrate 30 is more rigid, as shown in FIG. 3C.

Figure 4A:
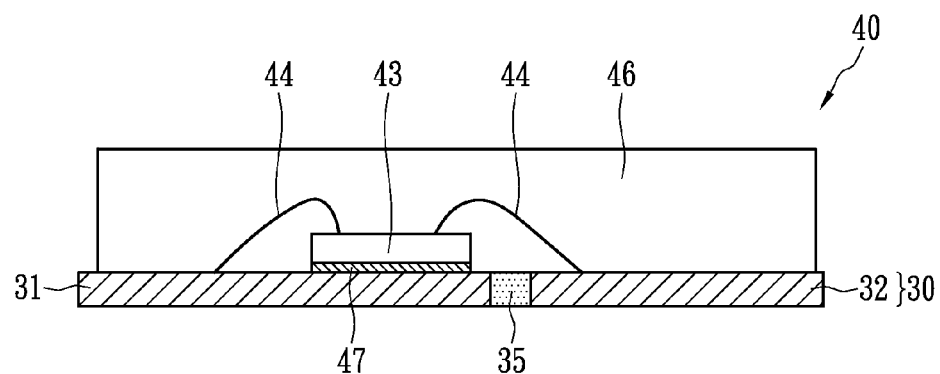
FIG. 4A is a cross-sectional diagram of the package structure of a compound semiconductor device in accordance with the present invention.

FIG. 4A is a cross-sectional diagram of the package structure of a compound semiconductor device in accordance with the present invention. A compound semiconductor device 40 utilizes the die-bonding technology to adhere a compound semiconductor die 43 to the first conductive film 31 of the thin film substrate 30, that is, the die 43 is mounted on the surface of the first conductive film 31 by a die-bonding adhesive 47. The die 43 can be an LED die, a laser diode die or a photo-diode die. Moreover, the die 43 and thin film substrate 30 are electrically connected to each other through metal wires 44 so that the thin film substrate 30 acts as the package carrier of the die 43 and metal wires 44. Final, by a molding process, a transparent encapsulation material 46 overlays the die 43, metal wires 44, and thin film substrate 30 in order to provide anti-moisture and protection effects. The transparent encapsulation material 46 can be epoxy resin or silicone.

Figure 4B:
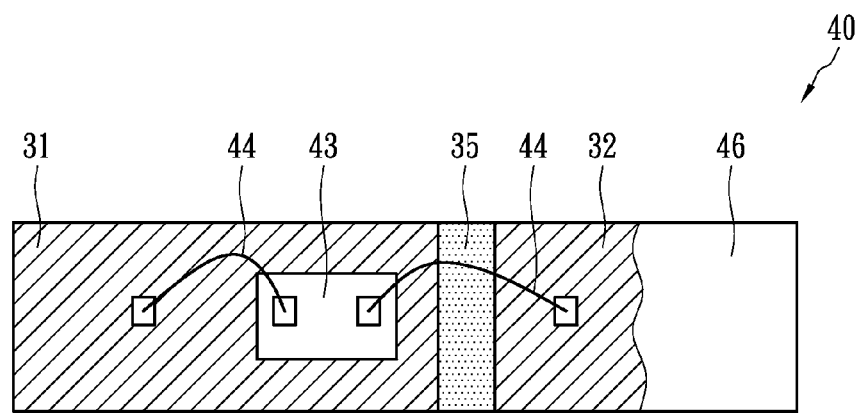
FIG. 4B is a top view of the compound semiconductor device in FIG. 4A.

FIG. 4B is a top view of the compound semiconductor device in FIG. 4A. For clearly illustrating the connection between the die 43, metal wires 44, and thin film substrate 30, a portion of the transparent encapsulation material 46 is removed. Two metal wires 44 respectively go from the surface of the die 43 toward the first conductive film 31 and the second conductive film 32, and connect them.

Figure 5:
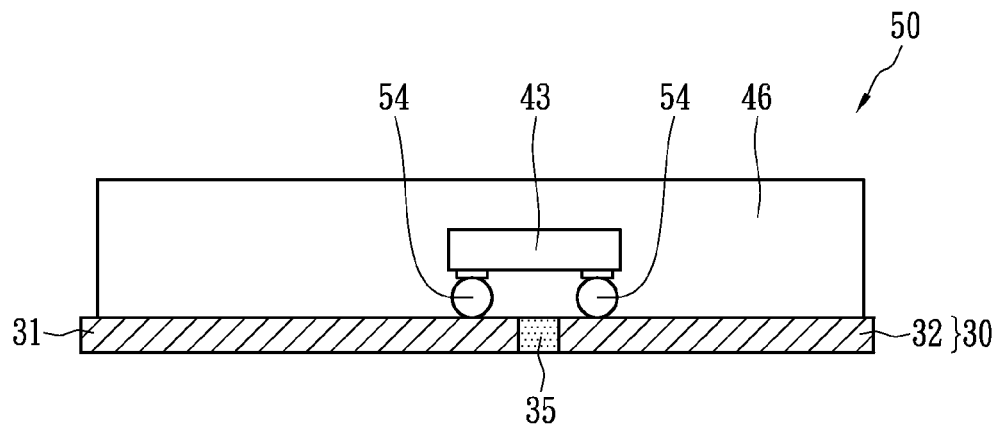
FIG. 5 is a cross-sectional diagram of the package structure of a compound semiconductor device in accordance with another embodiment of the present invention.

FIG. 5 is a cross-sectional diagram of the package structure of a compound semiconductor device in accordance with another embodiment of the present invention. The compound semiconductor device 50 utilizes a flip-chip bonding process to mount the die 43 on the thin film substrate 30 through bumps 54. Compared with FIG. 4A, the active surface of the die 43 faces the thin film substrate 30, and tin balls are utilized to connect the bonding pads of the die 43 and thin film substrate 30 to form the bumps 54. The bumps 54 are melted due to solder flux after a reflow process, and solidify to electrically connect them. Final, by a molding process, a transparent encapsulation material 46 overlays the die 43, metal wires 44, and thin film substrate 30 in order to have anti-moisture and protection effects. In this embodiment, there are several advantages such as short current paths and excellent heat dissipation. In addition, compared with the previous embodiment, the present invention can reduce the loop height of the metal wires.

Figure 6:
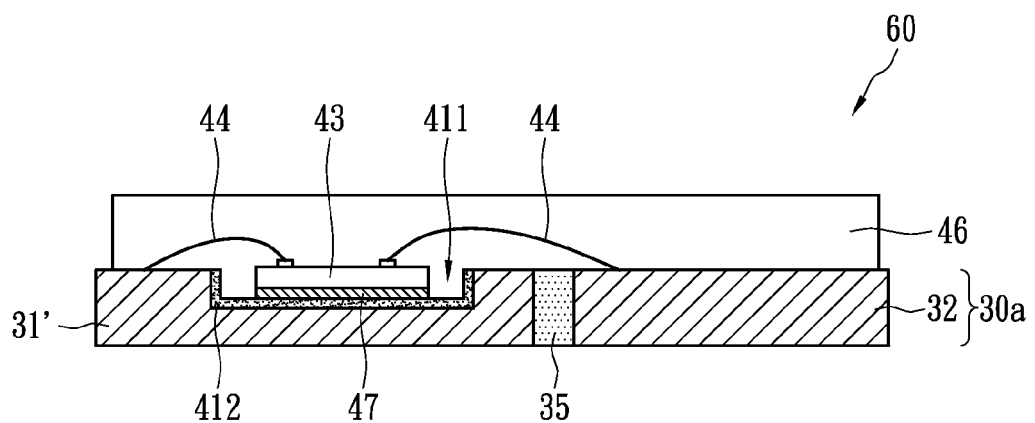
FIG. 6 is a cross-sectional diagram of the package structure of a compound semiconductor device in accordance with another embodiment of the present invention.

FIG. 6 is a cross-sectional diagram of the package structure of a compound semiconductor device in accordance with another embodiment of the present invention. Regarding this embodiment, the thickness of the package structure is further reduced and the illumination brightness of the device is increased. A die-bonding groove 411 is formed on the first conductive film 31' of the thin film substrate 30a, and a reflecting layer 412 is deposited on the sidewalls and bottom of the die-bonding groove 411. The die-bonding groove 411 can be formed by a photolithography etching process, an electroforming process and a drilling process. The die 43 is adhered to the bottom of the die-bonding groove 411, and the die-bonding groove 411 acts as a cup-like reflective cavity. Lateral light emitted from the die 43 can be effectively reflected by the reflecting layer 412, and redirected towards the upper side. Therefore, the brightness of the compound semiconductor device 60 is improved. In this embodiment, another advantage is that when the die 43 is placed in the die-bonding groove 411 and the metal wires 44 electrically connect the die 44 and thin film substrate 30a, the height of the wire loop of the gold wires is significantly reduced so as to further reduce the thickness of the entire package structure.

Figure 7:
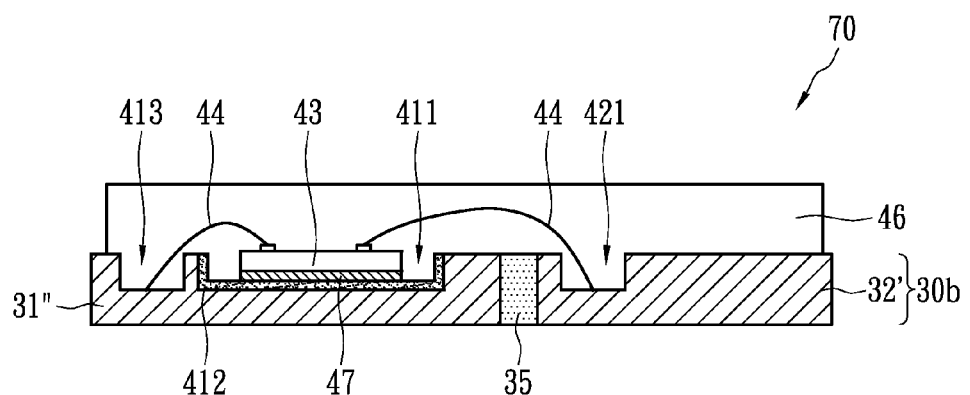
FIG. 7 is a cross-sectional diagram of the package structure of a compound semiconductor device in accordance with another embodiment of the present invention.

FIG. 7 is a cross-sectional diagram of the package structure of a compound semiconductor device in accordance with another embodiment of the present invention. Compared with the previous embodiment, this embodiment further reduces the thickness of the package structure. A wire-bonding groove 413 is formed on the first conductive film 31" of the thin film substrate 30b for one of the metal wires 44 to indicate the melting location of a second bond. Similarly, a wire-bonding groove 421 is formed on the second conductive film 32' for another of the metal wires 44 to indicate the melting location of a second bond. Because the second bond of the metal wire 44 is descended to the wire-bonding groove, the thickness of the package structure of the compound semiconductor device 60 is reduced.

Figure 8:
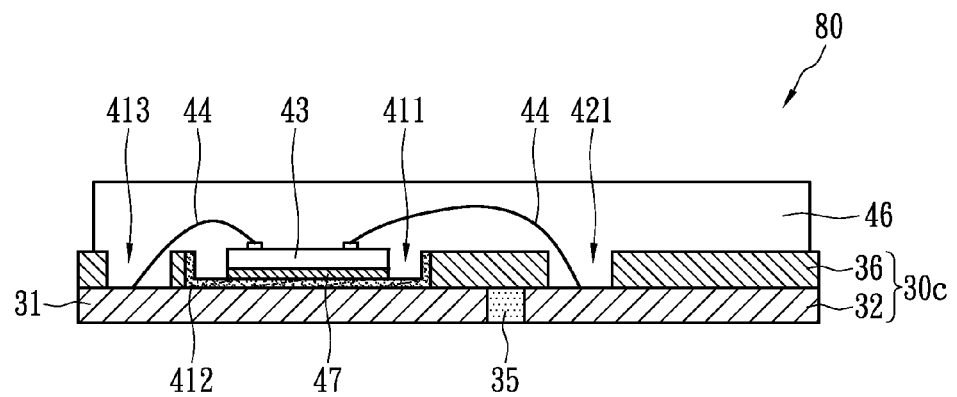
FIG. 8 is a cross-sectional diagram of the package structure of a compound semiconductor device in accordance with another embodiment of the present invention.
Figure 9A:
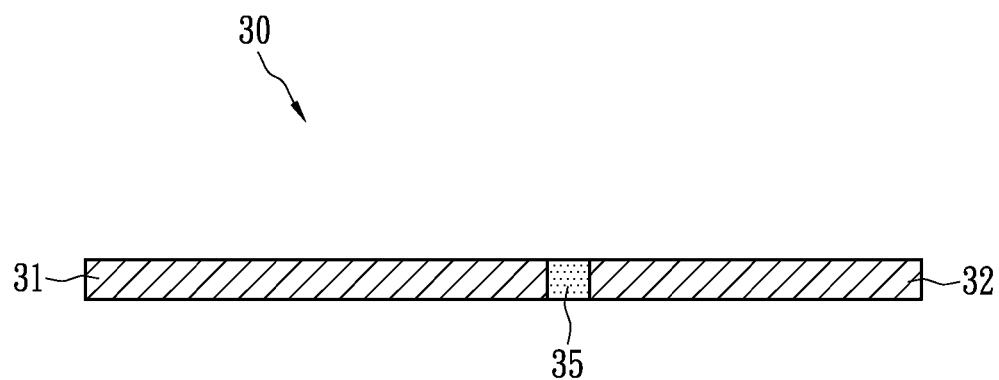
FIGS. 9A-9D are schematic illustrations showing the formation of a die-bonding groove or a wire-bonding groove by an electroforming process.
Figure 9B:
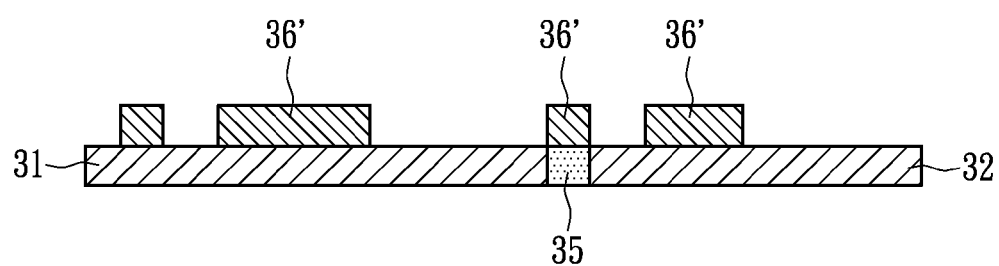
Figure 9C:
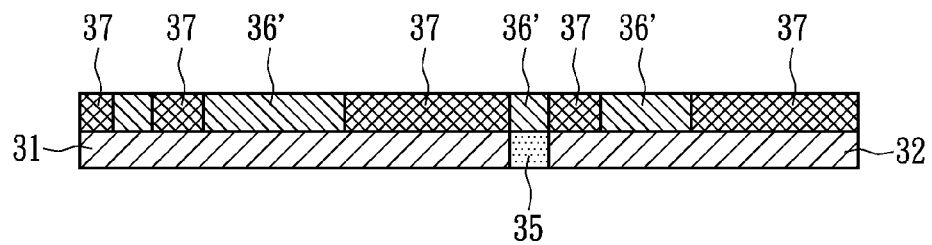
Figure 9D:
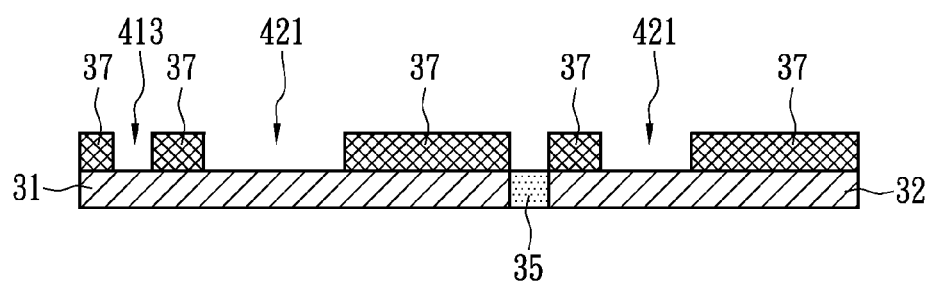

In the above embodiments, the die-bonding groove and wire-bonding groove are formed by a photolithography etching process, an electroforming process and a drilling process. Furthermore, a patterned insulating material layer 36 can be formed on the thin film substrate 30, and a die-bonding groove 411 and wire-bonding grooves 413 and 421 are formed on the insulating material layer 36, as shown in FIG. 8. Therefore, the thickness of the package structure of the compound semiconductor device 80 is reduced, which can prevent the metal wire 44 connected to the second conductive film 32 from short-circuit resulting from improperly contacting the first conductive film 31.

FIGS. 9A-9D are schematic illustrations showing the formation of a die-bonding groove or a wire-bonding groove by an electroforming process. A patterned insulating material layer 36' such as a photoresist material is formed on the thin film substrate 30. A metal layer 37 is gradually grown on the surfaces of the first conductive film 31 and the second conductive film 32 uncovered by the insulating material layer 36' by an electroforming process. Moreover, the insulating material layer 36' is removed (for example, a photoresist striping step) to expose the die-bonding groove 411 and wire-bonding grooves 413 and 421.

The above-described embodiments of the present invention are intended to be illustrative only. Those skilled in the art may devise numerous alternative embodiments without departing from the scope of the following claims.

What is claimed is:

1. A manufacturing method of a package structure of a compound semiconductor device, comprising the steps of:
   providing a sheet;
   forming at least one slot on the sheet to divide the sheet into a first conductive film and a second conductive film;
   filling an insulating dielectric material in the slot, thereby the first conductive film, the second conductive film and the insulating dielectric material cooperatively constituting a thin film substrate;
   stacking a patterned insulating material layer on the thin film substrate to cover the first conductive film, the insulating dielectric material and the second conductive film, the patterned insulating material layer comprising a die-bonding groove and two wire-bonding grooves, a portion of the first conductive film being exposed at a bottom of the die-bonding groove, another portion of the first conductive film being exposed at a bottom of one of the wire-bonding grooves and a portion of the second conductive film being exposed at a bottom of the other of the wire-boding grooves;
   mounting a die onto the portion of the first conductive film exposed at a bottom of the die-bonding groove, electrically connecting an anode of the die to the another portion of the first conductive film exposed at a bottom of one of the wire-boding grooves, and electrically connecting a cathode of the die to the portion of the second conductive film exposed at a bottom of the other of the wire-boding grooves; and
   overlaying a transparent encapsulation material on the die.

2. The manufacturing method of a package structure of a compound semiconductor device of claim 1, wherein the slot is formed by a drilling process, an etching process or a punching process.

3. The manufacturing method of a package structure of a compound semiconductor device of claim 1, wherein the wire-bonding grooves are formed by a photolithography etching process.

* * * * *